(12) United States Patent
Lee et al.

(10) Patent No.: US 10,797,240 B2
(45) Date of Patent: Oct. 6, 2020

(54) INKJET PRINTING APPARATUS AND PRINTING METHOD USING THE SAME

(71) Applicant: SAMSUNG DISPLAY CO., LTD., Yongin-si, Gyeonggi-Do (KR)

(72) Inventors: Hansol Lee, Yongin-si (KR); Heungcheol Jeong, Yongin-si (KR); Myungsoo Huh, Yongin-si (KR); Dohun Lee, Yongin-si (KR); Ilseok Jeong, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/130,026

(22) Filed: Sep. 13, 2018

(65) Prior Publication Data
US 2019/0173010 A1 Jun. 6, 2019

(30) Foreign Application Priority Data
Dec. 6, 2017 (KR) .......................... 10-2017-0166648

(51) Int. Cl.
| | | |
|---|---|---|
| H01L 51/00 | (2006.01) | |
| H01L 51/56 | (2006.01) | |
| B41J 2/03 | (2006.01) | |
| B41J 2/17 | (2006.01) | |
| H01L 27/32 | (2006.01) | |

(52) U.S. Cl.
CPC ............ *H01L 51/0005* (2013.01); *B41J 2/03* (2013.01); *B41J 2/1714* (2013.01); *H01L 51/56* (2013.01); *B41J 2002/031* (2013.01); *H01L 27/3244* (2013.01)

(58) Field of Classification Search
CPC . H01L 51/0005; H01L 51/56; H01L 27/3244; B41J 2/1714; B41J 2/03; B41J 2002/031
See application file for complete search history.

(56) References Cited

U.S. PATENT DOCUMENTS

| | | | |
|---|---|---|---|
| 9,067,437 B2 | 6/2015 | Masuda | |
| 2013/0004656 A1 | 1/2013 | Chen et al. | |
| 2013/0057605 A1* | 3/2013 | Miwa | ................. B41J 29/38 347/6 |
| 2015/0085014 A1* | 3/2015 | Ishida | .................. B41J 2/1714 347/34 |
| 2015/0273835 A1* | 10/2015 | Arimizu | ............... B41J 2/16585 347/30 |
| 2016/0144621 A1 | 5/2016 | Lowrance et al. | |
| 2017/0217192 A1 | 8/2017 | Imahashi et al. | |

FOREIGN PATENT DOCUMENTS

| | | |
|---|---|---|
| JP | 2010-201742 A | 9/2010 |
| JP | 2014-002918 A | 1/2014 |
| JP | 2014-162121 A | 9/2014 |
| KR | 10-2017-0069302 A | 6/2017 |
| KR | 10-2017-0107589 A | 9/2017 |

* cited by examiner

*Primary Examiner* — Huan H Tran
*Assistant Examiner* — Alexander D Shenderov
(74) *Attorney, Agent, or Firm* — Kile Park Reed & Houtteman PLLC

(57) ABSTRACT

An inkjet printing apparatus includes an ink jetting unit to jet ink to a substrate, a stage to movably support the substrate relative to the ink jetting unit, and a pair of air-conditioning units arranged at front and rear ends of the ink jetting unit in a direction in which the stage is moved, the air-conditioning units each including an air blowing unit and a suction unit.

18 Claims, 4 Drawing Sheets

INKJET PRINTING APPARATUS AND PRINTING METHOD USING THE SAME

CROSS-REFERENCE TO RELATED APPLICATION

Korean Patent Application No. 10-2017-0166648, filed on Dec. 6, 2017, in the Korean Intellectual Property Office, and entitled: "Inkjet Printing Apparatus and Printing Method Using the Same," is incorporated by reference herein in its entirety.

BACKGROUND

1. Field

Embodiments relate to an inkjet printing apparatus and a printing method using the apparatus.

2. Description of the Related Art

In a manufacturing operation of a thin film such as a light-emitting layer of an organic light-emitting display device, an inkjet printing process of forming a thin film in a desired form by jetting ink to an object surface may be used. Thus, by jetting ink to a predetermined position on a substrate, which is an object, a thin film is printed on the substrate in a desired pattern.

SUMMARY

Embodiments are directed to an inkjet printing apparatus, including an ink jetting unit to jet ink to a substrate, a stage to movably support the substrate relative to the ink jetting unit, and a pair of air-conditioning units arranged at front and rear ends of the ink jetting unit in a direction in which the stage is moved, the air-conditioning units each including an air blowing unit and a suction unit.

The suction unit may be arranged in an inner portion with respect to the ink jetting unit, and the air blowing unit may be arranged in an outer portion with respect to the suction unit.

The air blowing unit may include an internal air blowing unit to jet air to the substrate at an inclination angle facing the inner portion, and an external air blowing unit to jet air to the substrate at an inclination angle facing the outer portion.

An opening and closing valve selectively blocking jetting of air may be mounted in each of the internal air blowing unit and the external air blowing unit.

Jet outlets of the internal air blowing unit and the external air blowing unit, and absorption inlets of the suction units, may each be a single hole.

Jet outlets of the internal air blowing unit and the external air blowing unit, and absorption inlets of the suction units, may each include divided holes.

The air blowing unit may be to form an air curtain in front of and at the back of an inkjet space between the substrate and the ink jetting unit, so as to impede incorporation of an external current into the inkjet space or scattering of residues of the ink jetted from the ink jetting unit, from the inkjet space to the outside.

The suction unit may be to absorb residues of the ink that are not printed on the substrate but left in an inkjet space between the substrate and the ink jetting unit, and to discharge the residues of the ink to the outside.

An opening and closing valve to selectively block absorption of the residues of the ink may be mounted in the suction unit.

The stage may be to reciprocate the substrate relative to the ink jetting unit.

Embodiments are also directed to an inkjet printing method, including preparing an ink jetting unit that jets ink to a substrate, a stage that movably supports the substrate relative to the ink jetting unit, and a pair of air-conditioning units arranged at front and rear ends of the ink jetting unit in a direction in which the stage is moved, the air-conditioning units each including an air blowing unit and a suction unit, moving the stage relative to the ink jetting unit in one direction, forming a thin film on the substrate by jetting ink by using the ink jetting unit, forming an air curtain in front of and at the back of an inkjet space between the ink jetting unit and the substrate by jetting air by using the air blowing unit, and absorbing residues of the ink that did not contribute to forming of the thin film by using the suction unit and discharging the residues of the ink to the outside.

The suction unit may be arranged in an inner portion with respect to the ink jetting unit, and the air blowing unit may be arranged in an outer portion with respect to the suction unit.

The air blowing unit may include an internal air blowing unit jetting air to the substrate at an inclination angle facing the inner portion, and an external air blowing unit jetting air to the substrate at an inclination angle facing the outer portion.

The air blowing unit arranged at the front end of the ink jetting unit with respect to the moving direction of the stage may operate only the external air blowing unit, and the air blowing unit arranged at the rear end of the ink jetting unit may operate only the internal air blowing unit.

The inkjet printing method may further include inspecting an ink jetting amount, the inspecting including placing the ink jetting unit and the air-conditioning unit on a scale plate.

In the inspecting of an ink jetting amount, the air blowing units of the pair of air-conditioning units may operate only the respective external air blowing unit.

Jet outlets of the internal air blowing unit and the external air blowing unit, and absorption inlets of the suction units, may each be a single hole.

Jet outlets of the internal air blowing unit and the external air blowing unit, and absorption inlets of the suction units, may each include a plurality of divided holes.

An air curtain formed using the air blowing unit may impede at least one of incorporation of an external current into the inkjet space, or scattering of residues of the ink, jetted from the ink jetting unit, from the inkjet space to the outside.

The inkjet printing method may further include, while moving the stage in a different direction, repeating forming of a thin film by using the ink jetting unit, forming of an air curtain by using the air blowing unit, and discharging the residues of the ink by using the suction unit.

BRIEF DESCRIPTION OF THE DRAWINGS

Features will become apparent to those of skill in the art by describing in detail example embodiments with reference to the attached drawings in which.

DETAILED DESCRIPTION

Figure 1:
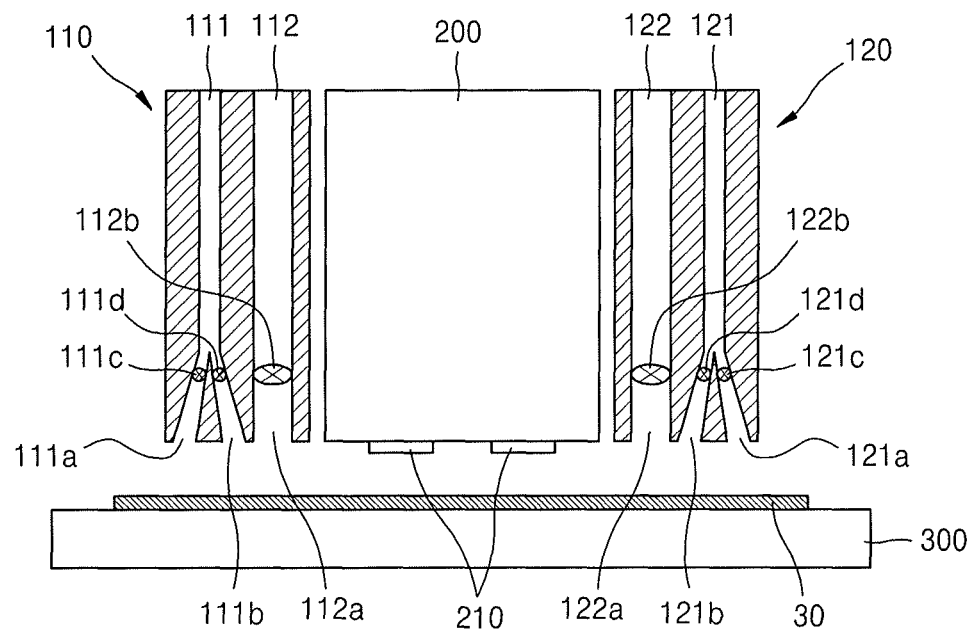
FIG. 1 illustrates a schematic cross-sectional view of an inkjet printing apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. Like reference numerals refer to like elements throughout.

Singular expressions, unless defined otherwise in contexts, include plural expressions.

In the embodiments below, it will be further understood that the terms "comprise" and/or "have" used herein specify the presence of stated features or components, but do not preclude the presence or addition of one or more other features or components.

When an embodiment is implementable in another manner, a predetermined process order may be different from a described one. For example, two processes that are consecutively described may be substantially simultaneously performed or may be performed in an opposite order to the described order.

FIG. 1 is a schematic cross-sectional view of an inkjet printing apparatus according to an example embodiment.

As illustrated in FIG. 1, the inkjet printing apparatus according to the present example embodiment may include an ink jetting unit 200 for jetting ink to a substrate 30, a stage 300 movably supporting the substrate 30 relative to the ink jetting unit 200, and a pair of air-conditioning units 110 and 120 arranged at front and rear ends of the ink jetting unit 200 in a direction in which the stage 300 moves.

The stage 300 may reciprocate to the left and right of the drawing to move the substrate 30 relative to the ink jetting unit 200. In another implementation, as another method of relative movement, the stage 300 may be fixed, and the ink jetting unit 200 and the air-conditioning units 110 and 120 may reciprocate with respect to the substrate 30.

The pair of air-conditioning units 110 and 120 may respectively include suction units 112 and 122 that are in an inner portion with respect to the ink jetting unit 200, and air blowing units 111 and 121 blowing air in an outer portion with respect to the suctions units 112 and 122. For convenience, the air-conditioning unit 110 on the left side of the drawing is referred to as a first air-conditioning unit, and the air-conditioning unit 120 on the right side is referred to as a second air-conditioning unit.

The air blowing units 111 and 121 of the first and second air-conditioning units 110 and 120 may respectively include external air blowing portions 111a and 121a and internal air blowing portions 111b and 121b having jet outlets that are selectively opened or closed via opening and closing valves 111c, 111d, 121c, and 121d.

The internal air blowing units 111b and 121b may jet air to the substrate 30 to the inner side, that is, to the substrate 30, at an inclination angle facing an inkjet space between the ink jetting unit 200 and the substrate 30, and the external air blowing units 111a and 121a may jet air to the substrate 30 at an inclination angle facing an outer side opposite the inner side. Thus, the internal air blowing units 111b and 121 b and the external air blowing units 111a and 121a may have opposite jetting directions, and the direction in which air is to be jetted may be controlled by the opening and closing valves 111c, 111d, 121c, and 121d.

Figure 2:
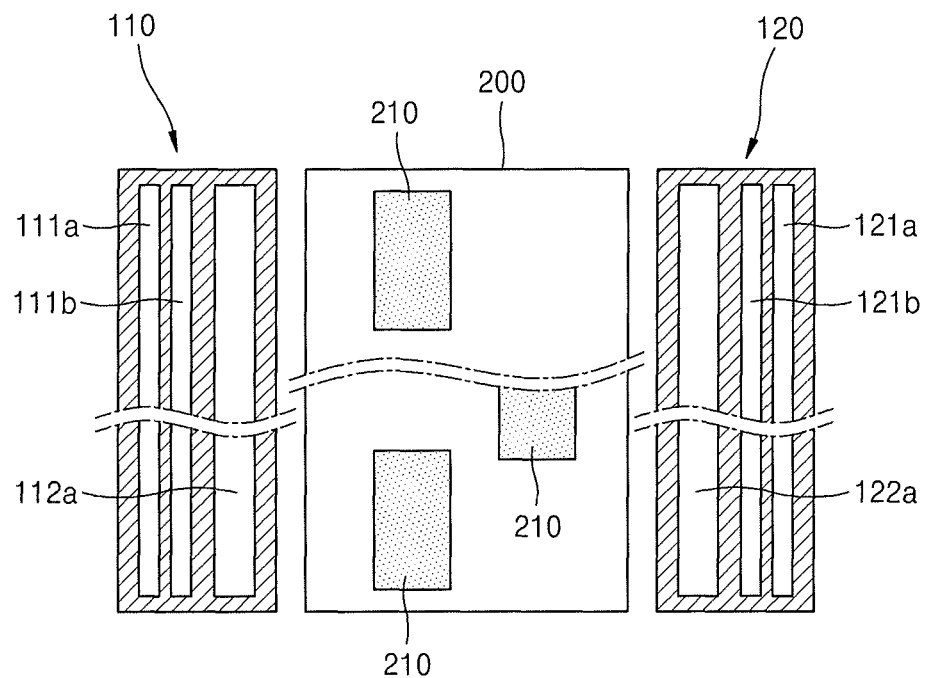
FIG. 2 illustrates a bottom view of the inkjet printing apparatus illustrated in FIG. 1.

A plurality of nozzle units 210 may be arranged on a bottom surface of the ink jetting unit 200, as illustrated in FIG. 2, and jet outlets of the internal air blowing units 111b and 121b and the external air blowing units 111a and 121a and absorption inlets 112a and 122a of the suction units 112 and 122 may have, for example, a single long-hole shape.

Reference numerals 112b and 122b denote opening and closing valves via which to select an absorption operation through the absorption inlets 112a and 122a of the suction units 112 and 122.

A thin film printing operation by using the inkjet printing apparatus as described above will be described below, and now an example of the substrate 30 on which printing may be performed by using the inkjet printing apparatus will be briefly described.

Figure 7:
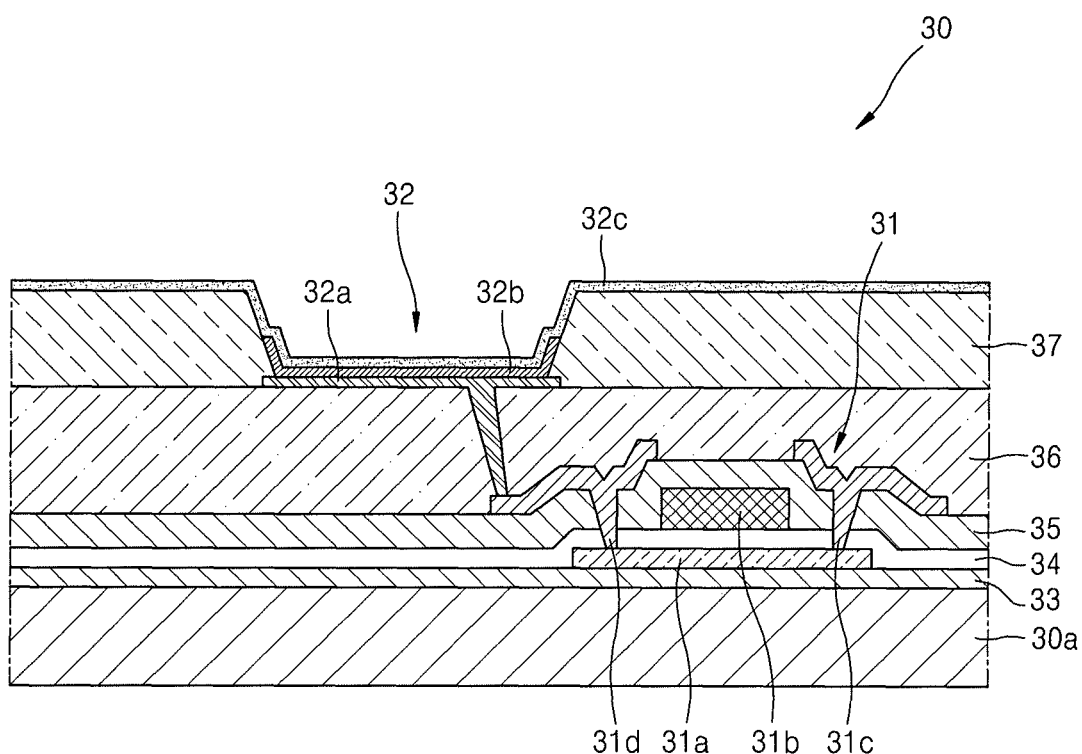
FIG. 7 illustrate a schematic cross-sectional view of a structure of an organic light-emitting display apparatus as an example of a target object that may be manufactured using the inkjet printing apparatus illustrated in FIG. 1.

FIG. 7 illustrates a schematic cross-sectional view of a structure of an organic light-emitting display apparatus as an example of the substrate 30 on which a thin film may be printed using the inkjet printing apparatus according to an embodiment.

Referring to FIG. 7, a buffer layer 33 may be formed on a base substrate 30a, and a thin film transistor 31 and an organic light-emitting device 32 may be formed on the buffer layer 33.

The thin film transistor 31 may include an active layer 31a, a gate insulating layer 34 covering the active layer 31a, and a gate electrode 31b on the gate insulating layer 34.

An interlayer insulating layer 35 may be formed to cover the gate electrode 31b, and a source electrode 31c and a drain electrode 31d may be formed on the interlayer insulating layer 35.

The source electrode 31c and the drain electrode 31d may be respectively in contact with a source region and a drain region of the active layer 31a via a contact hole formed in each of the gate insulating layer 34 and the interlayer insulating layer 35.

A pixel electrode 32a of the organic light-emitting device 32 may be connected to the drain electrode 31d. The pixel electrode 32a may be formed on a planarization layer 36, and a pixel-defining layer 37 defining a sub-pixel region may be formed on the pixel electrode 32a. In addition, a light-emitting layer 32b of the organic light-emitting device 32 may be formed in an opening portion of the pixel-defining layer 37, and an opposite electrode 32c may be deposited on the light-emitting layer 32b. Thus, the opening portion surrounded by the pixel-defining layer 37 may be a region of one sub-pixel such as a red pixel R, a green pixel G, or a blue pixel B, and the light-emitting layer 32b of a corresponding color may be formed in the opening portion. While one sub-pixel is illustrated in FIG. 7, a plurality of sub-pixels as described above may be arranged in row and column directions in a display unit.

Thin films of the organic light-emitting display apparatus as described above may be formed by printing by using the inkjet printing apparatus described above, and for example, by jetting ink to a location corresponding to the light-emitting layer 32b, the light-emitting layer 32b having a desired pattern may be formed.

Hereinafter, a thin film printing operation to be performed using the inkjet printing apparatus will be described with reference to FIGS. 3 and 4.

As described above, during a printing operation, the stage 300 may reciprocate the substrate 30 to the left and right. FIG. 3 illustrates a state where printing is performed as the substrate 30 is moved to the right side of the drawing, and FIG. 4 illustrates a state where printing is performed as the substrate 30 is moved to the left side of the drawing.

Figure 3:
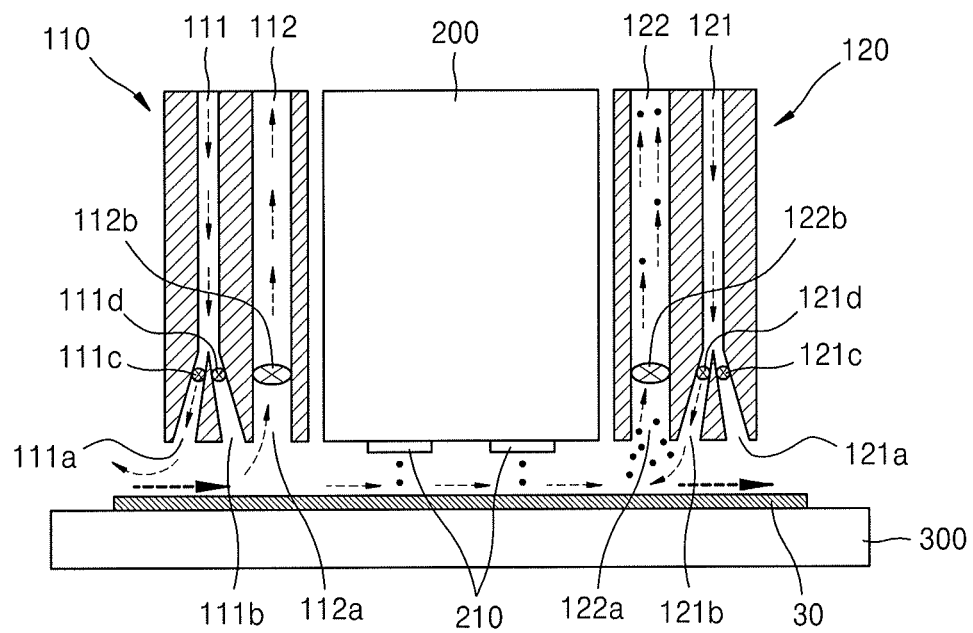
FIGS. 3 and 4 illustrate cross-sectional views of an inkjet printing operation performed using the inkjet printing apparatus illustrated in FIG. 1.

First, an operation of printing a thin film as the stage 300 moves the substrate 30 to the right side, as illustrated in FIG. 3, may be performed as follows.

First, while the substrate 30 is being moved to the right side, ink may be jetted from the nozzle unit 210 of the ink jetting unit 200 to a location where a desired thin film is to be formed. Here, a portion of the jetted ink may contribute to formation of the thin film, and a residue of the ink that has not contributed to the formation of the thin film may float as mist. If the mist is neglected, the mist may adhere to undesired points and cause contamination. According to the present example embodiment, ink residues may be immediately absorbed using the suction units 112 and 122 of the first and second air-conditioning units 110 and 120 to be discharged. Exhaust paths through the absorption inlets 112a and 122a may be opened via the opening and closing valves 112b and 122b.

Internal and external portions of the air blowing units 111 and 121 of the first and second air-conditioning units 110 and 120 may operate in an opposite manner to each other. Thus, the air blowing unit 111 of the first air-conditioning unit 110 may blow air while the opening and closing valve 111c of the external air-blowing unit 111a is opened, and the opening and closing valve 111d of the internal air-blowing unit 111b is closed, and the air blowing unit 121 of the second air-conditioning unit 120 may blow air while the opening and closing valve 121c of the external air-blowing unit 121a is closed, and the opening and closing valve 121d of the internal air-blowing unit 121b is opened. Thus, both the air blowing units 111 and 121 may blow air at an inclination angle facing a direction opposite to a direction in which the substrate 30 is moved. Accordingly, an air curtain effect, whereby incorporation of an external current into an inkjet area between the ink jetting unit 200 and the substrate 30 or scattering of the ink residues floating in the inkjet area to the outside is prevented, may be maximized.

According to the present example embodiment, ink residues floating in the inkjet area between the ink jetting unit 200 and the substrate 30 tend to escape along the right side in a direction in which the substrate 30 is moved. Accordingly, the air blowing unit 121 of the second air-conditioning unit 120 at a rear end of the ink jetting unit 200 may open the internal air blowing unit 121b to blow air in a reverse direction to the moving direction of the substrate 30, thereby firmly blocking a flow of a fluid that tends to escape the inkjet area.

At the front end of the ink jetting unit 200, an external current may tend to enter the inkjet area along with movement of the substrate 30. Accordingly, the air blowing unit 111 of the first air-conditioning unit 110 at the front end of the ink jetting unit 200 may open the external air blowing unit 111a to blow air in a reverse direction to the movement direction of the substrate 30, thereby firmly blocking a flow of an external current that tends to enter the inkjet area.

As the ink residues are discharged using the suction unit 112 and 122 while a strong air curtain is formed each in front of and at the back of the inkjet area as described above, printing defects due to incorporation of an external current or contamination by the ink residues may be reduced or prevented, and a more precise thin film printing quality may be provided.

According to the present example embodiment, the air blowing unit 111 of the air conditioning unit 110 does not just prevent incorporation of an external current, and the air blowing unit 121 of the second air conditioning unit 120 does not just prevent scattering of the ink residue, respectively; rather, both the air blowing unit 111 of the first air-conditioning unit 110 and the air blowing unit 121 of the second air-conditioning unit 120 may function as air curtains to prevent incorporation of an external current and scattering of ink residue. By controlling the air direction such that the effects at the front and rear ends are maximized, defects such as contamination of the surroundings may be reduced or prevented.

According to an example embodiment, performing thin film printing as the substrate 30 is moved to the right side, as illustrated in FIG. 3, may be summarized with respect to valve opening states as follows: the printing operation is performed while the opening and closing valve 111c of the external air blowing unit 111a of the first air-conditioning unit 110, the opening and closing valve 111d of the internal air blowing unit 121b of the second air-conditioning unit 120, and the opening and closing valves 112b and 122b of the suction units 112 and 122 on both sides are opened, and the opening and closing valve 111d of the internal air blowing unit 111b of the first air-conditioning unit 110 and the opening and closing valve 121c of the external air blowing unit 121a and of the second air-conditioning unit 120 are closed.

Figure 4:
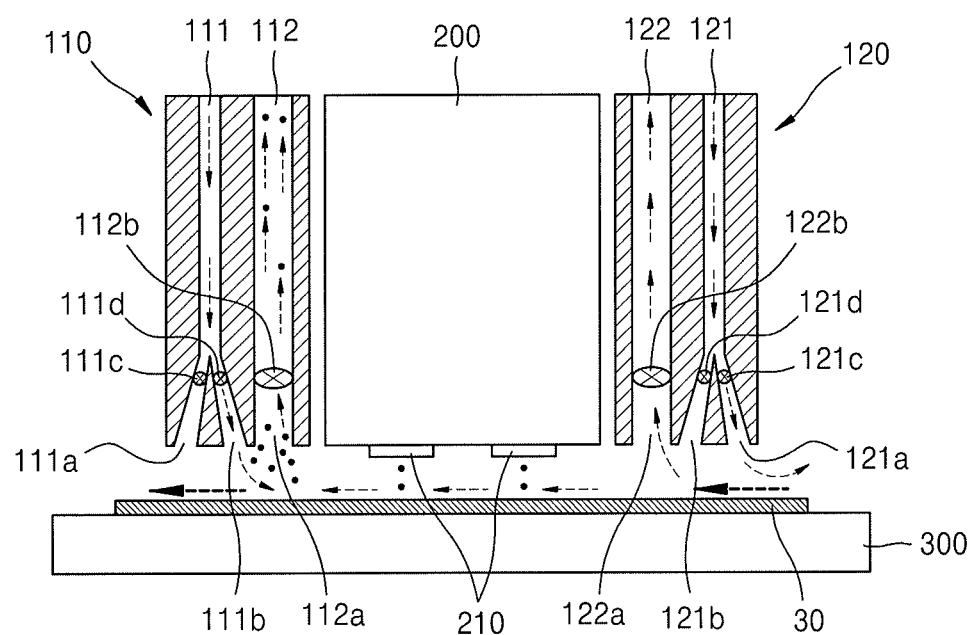

After printing a thin film by moving the substrate 30 to the right side, a thin film may be printed immediately thereafter by moving the substrate 30 to the left as illustrated in FIG. 4. Here, the direction of moving the substrate 30 is reversed, and the direction in which the air is blown is also reversed.

Thus, the air blowing unit 121 of the second air-conditioning unit 120 may blow air while the opening and closing valve 121c of the external air blowing unit 121a is opened, and the opening and closing valve 121d of the internal air blowing unit 121b is closed, and the air blowing unit 111 of the first air-conditioning unit 110 may blow air while the opening and closing valve 111c of the external air blowing unit 111a is closed, and the opening and closing valve 111d of the internal air blowing unit 111b is opened. The two air blowing units 111 and 121 may blow air at an inclination angle facing an opposite direction to the direction in which the substrate 30 is moved.

According to the present example embodiment, ink residues floating in the inkjet area between the ink jetting unit 200 and the substrate 30 and tending to escape to the left side along the moving direction of the substrate 30, and an external current tending to enter the inkjet area along with the movement of the substrate 30 at the front end of the ink jetting unit 200, may be firmly blocked by blowing air in a reverse direction to the moving direction of the substrate 30.

As the ink residues are discharged using the suction units 112 and 122 while a strong air curtain is formed in front of and at the back of the inkjet area, printing defects due to incorporation of an external current or due to contamination by the ink residues may be reduced or prevented, and a precise thin film printing quality may be provided.

According to an example embodiment, printing a thin film by moving the substrate 30 to the left side, as illustrated in FIG. 4, may be summarized with respect to valve opening states as follows: the printing operation is performed while the opening and closing valve 111*d* of the internal air blowing unit 111*b* of the first air-conditioning unit 110, the opening and closing valve 121*c* of the external air blowing units 121*a* of the second air-conditioning unit 120, and the opening and closing valves 112*b* and 122*b* of the suction units 112 and 122 on both sides are opened, and the opening and closing valve 111*c* of the external air blowing units 111*a* of the first air-conditioning unit 110 and the opening and closing valve 121*d* of the internal air blowing unit 121*b* of the second air-conditioning unit 120 are closed.

By discharging the ink residues after forming an effective air curtain in front of and at the back of the inkjet area in the above-described manner, potential defects due to incorporation of an external current or contamination may be reduced or prevented.

According to an example embodiment, inspection process of checking whether an appropriate amount of ink is being jetted may be regularly performed on the inkjet printing apparatus.

Figure 5:
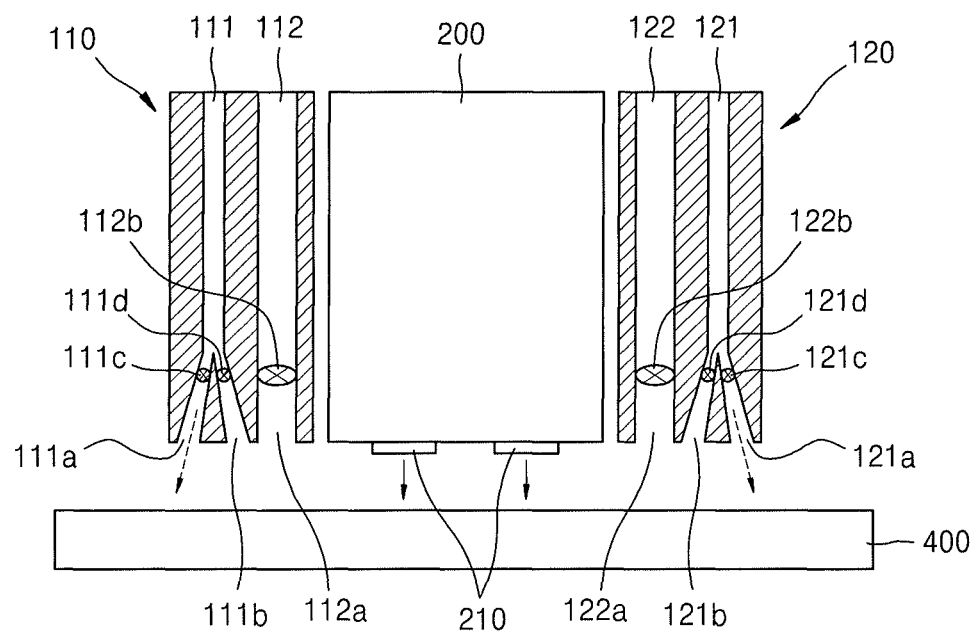
FIG. 5 illustrate a cross-sectional view of an operation of inspecting the inkjet printing apparatus illustrated in FIG. 1.

For example, as illustrated in FIG. 5, the ink jetting unit 200 and the first and second air-conditioning units 110 and 120 may be placed on a scale plate 400 instead of the stage 300, ink may be jetted onto the scale plate 400 by using the ink jetting unit 200, and then whether a desired weight is properly jetted may be measured. There may be no relative movement of the scale plate 400. Ink may not be continuously jetted so as to create ink residues, but what is only necessary is to prevent incorporation of an external air. According to the present example embodiment, both the first and second air-conditioning units 110 and 120 may open the external air blowing units 111*a* and 121*a* to form an air curtain, and may keep the internal blowing units 111*b* and 121*b* and the suction units 112 and 122 closed.

As described above, an optimum air blowing direction may be selected and used not only in a thin film printing operation but also in an inspection process.

Figure 6:
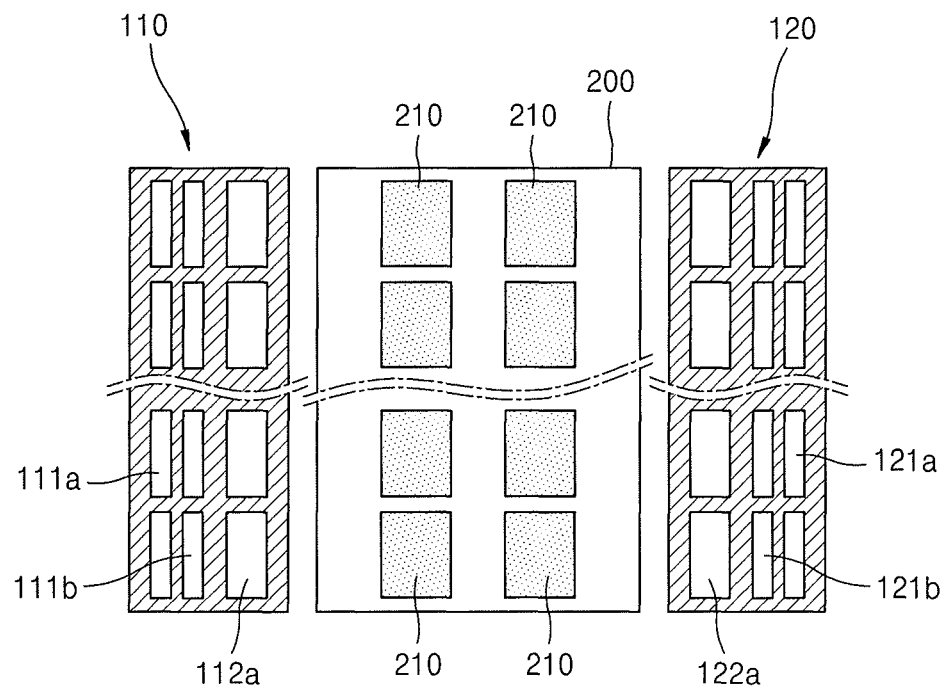
FIG. 6 illustrate a bottom view of a modified example of a structure of the bottom surface of the inkjet printing apparatus illustrated in FIG. 2.

In the above-described embodiment, while the jet outlets of the internal air blowing units 111*b* and 121*b* and the external air blowing units 111*a* and 121*a*, and the absorption inlets 111*b* and 121*b* of the suction units 112 and 122 having a single long-hole shape are respectively illustrated as in FIG. 2, all of the jet outlets and the adsorption inlets may also be formed as divided holes respectively corresponding to locations of the plurality of nozzle units 210, as illustrated in FIG. 6.

By way of summation and review, precision formation of thin films in an inkjet printing process may be improved by preventing an external current in an area where ink is jetted. Further, it is desirable that residues of the ink in the form of mist, which are left after failing to contribute to the forming of thin films, be quickly recollected so as to prevent contamination of unexpected points on the substrate.

As described above, embodiments relate to an inkjet printing apparatus for forming a thin film on an object surface by inkjetting, and a printing method using the apparatus. Embodiments may provide an improved inkjet printing apparatus that effectively prevents incorporation of an external air current into an area where ink is jetted, and that efficiently and quickly recollects ink residues, and a printing method using the inkjet printing apparatus.

According to the inkjet printing apparatus and the inkjet printing method performed using the inkjet printing apparatus as described above, incorporation of an external current into an area where ink is jetted may be effectively prevented and ink residues may be efficiently and quickly recollected using the air conditioning units. Accordingly, precision of forming of thin films may be improved and contamination of the surroundings may be minimized, which may improve product quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An inkjet printing apparatus, comprising:
   an ink jetting unit to jet ink to a substrate;
   a stage to movably support the substrate relative to the ink jetting unit; and
   a pair of air-conditioning units arranged at front and rear ends of the ink jetting unit in a direction in which the stage is moved, the air-conditioning units each including a suction unit arranged in an inner portion with respect to the ink jetting unit and an air blowing unit that includes an internal air blowing unit and an external air blowing unit arranged in an outer portion with respect to the suction unit.

2. The inkjet printing apparatus as claimed in claim 1, wherein
   the internal air blowing unit is to jet air to the substrate at an inclination angle facing the inner portion, and
   the external air blowing unit is to jet air to the substrate at an inclination angle facing the outer portion.

3. The inkjet printing apparatus as claimed in claim 2, wherein an opening and closing valve selectively blocking jetting of air is mounted in each of the internal air blowing unit and the external air blowing unit.

4. The inkjet printing apparatus as claimed in claim 2, wherein jet outlets of the internal air blowing unit and the external air blowing unit, and absorption inlets of the suction units, are each a single hole.

5. The inkjet printing apparatus as claimed in claim 2, wherein jet outlets of the internal air blowing unit and the external air blowing unit, and absorption inlets of the suction units, each include divided holes.

6. The inkjet printing apparatus as claimed in claim 1, wherein the air blowing units are to form an air curtain in front of and at the back of an inkjet space between the substrate and the ink jetting unit, so as to impede incorporation of an external current into the inkjet space or scattering of residues of the ink jetted from the ink jetting unit, from the inkjet space to the outside.

7. The inkjet printing apparatus as claimed in claim 1, wherein the suction unit is to absorb residues of the ink that are not printed on the substrate but left in an inkjet space between the substrate and the ink jetting unit, and to discharge the residues of the ink to the outside.

8. The inkjet printing apparatus as claimed in claim 7, wherein an opening and closing valve to selectively block absorption of the residues of the ink is mounted in the suction unit.

9. The inkjet printing apparatus as claimed in claim 1, wherein the stage is to reciprocate the substrate relative to the ink jetting unit.

10. An inkjet printing method, comprising:
preparing an ink jetting unit that jets ink to a substrate, a stage that movably supports the substrate relative to the ink jetting unit, and a pair of air-conditioning units arranged at front and rear ends of the ink jetting unit in a direction in which the stage is moved, the air-conditioning units each including a suction unit arranged in an inner portion with respect to the ink jetting unit and an air blowing unit that includes an internal air blowing unit and an external air blowing unit arranged in an outer portion with respect to the suction unit;
moving the stage relative to the ink jetting unit in one direction;
forming a thin film on the substrate by jetting ink by using the ink jetting unit;
forming an air curtain in front of and at the back of an inkjet space between the ink jetting unit and the substrate by jetting air by using the air blowing units; and
absorbing residues of the ink that did not contribute to forming of the thin film by using the suction unit and discharging the residues of the ink to the outside,
wherein the air blowing unit includes an internal air blowing unit and an external air blowing unit.

11. The inkjet printing method as claimed in claim 10, wherein
the internal air blowing unit is to jet air to the substrate at an inclination angle facing the inner portion, and
the external air blowing unit is to jet air to the substrate at an inclination angle facing the outer portion.

12. The inkjet printing method as claimed in claim 11, wherein:
the air blowing unit arranged at the front end of the ink jetting unit with respect to the moving direction of the stage operates only the external air blowing unit, and
the air blowing unit arranged at the rear end of the ink jetting unit operates only the internal air blowing unit.

13. The inkjet printing method as claimed in claim 11, further comprising inspecting an ink jetting amount, the inspecting including placing the ink jetting unit and the air-conditioning unit on a scale plate.

14. The inkjet printing method as claimed in claim 13, wherein, in the inspecting of an ink jetting amount, the air blowing units of the pair of air-conditioning units operate only the respective external air blowing unit.

15. The inkjet printing method as claimed in claim 11, wherein jet outlets of the internal air blowing unit and the external air blowing unit, and absorption inlets of the suction units, are each a single hole.

16. The inkjet printing method as claimed in claim 11, wherein jet outlets of the internal air blowing unit and the external air blowing unit, and absorption inlets of the suction units, each include a plurality of divided holes.

17. The inkjet printing method as claimed in claim 10, wherein an air curtain formed using the air blowing unit impedes at least one of incorporation of an external current into the inkjet space, or scattering of residues of the ink, jetted from the ink jetting unit, from the inkjet space to the outside.

18. The inkjet printing method as claimed in claim 10, further comprising, while moving the stage in a different direction, repeating forming of a thin film by using the ink jetting unit, forming of an air curtain by using the air blowing unit, and discharging the residues of the ink by using the suction unit.

* * * * *